United States Patent [19]
Onitani et al.

[11] Patent Number: 5,658,835
[45] Date of Patent: Aug. 19, 1997

[54] GLASS-CERAMIC SINTERED BODY, A PROCESS FOR ITS PREPARATION AND A GLASS-CERAMIC SUBSTRATE

[75] Inventors: Masamitsu Onitani; Satoru Hamano; Takahiro Matsuoka; Hideto Yonekura, all of Kokubu, Japan

[73] Assignee: Kyocera Corporation, Kyoto, Japan

[21] Appl. No.: 468,135

[22] Filed: Jun. 6, 1995

[30] Foreign Application Priority Data

Jul. 25, 1994 [JP] Japan ................... 6-172384

[51] Int. Cl.$^6$ ................... C03C 10/02
[52] U.S. Cl. ................... 501/9; 501/10; 501/32; 501/67
[58] Field of Search ................... 501/9, 10, 32, 501/67

[56] References Cited

U.S. PATENT DOCUMENTS

| | | | |
|---|---|---|---|
| 4,624,934 | 11/1986 | Kokubu et al. | 501/32 |
| 4,687,750 | 8/1987 | Pinckney | 501/10 |
| 4,714,687 | 12/1987 | Holleron et al. | 501/9 |
| 4,764,486 | 8/1988 | Ishihara et al. | 501/9 |
| 4,777,092 | 10/1988 | Kawakami et al. | 501/32 |
| 4,897,509 | 1/1990 | Holleran et al. | 501/67 |
| 5,173,453 | 12/1992 | Beall et al. | 501/4 |
| 5,242,867 | 9/1993 | Lin et al. | 501/32 |
| 5,330,939 | 7/1994 | Marazzi et al. | 501/32 |
| 5,338,710 | 8/1994 | Ishigame et al. | 501/8 |
| 5,342,674 | 8/1994 | Tanei et al. | 501/32 |
| 5,356,841 | 10/1994 | Mizutani et al. | 501/32 |
| 5,407,871 | 4/1995 | Mizutani et al. | 501/32 |
| 5,476,821 | 12/1995 | Beall et al. | 501/10 |
| 5,491,116 | 2/1996 | Beall et al. | 501/5 |
| 5,561,089 | 10/1996 | Ishizaki et al. | 501/10 |

*Primary Examiner*—Mark L. Bell
*Assistant Examiner*—Louis Troilo
*Attorney, Agent, or Firm*—Loeb & Loeb LLP

[57] ABSTRACT

A glass-ceramic sintered body comprising an $SiO_2$—$Al_2O_3$—$MgO$—$ZnO$—$B_2O_3$ type crystalline glass and alumina, said sintered body containing at least 10% by weight of a spinel crystalline phase; and a substrate composed of the sintered material. There is also provided a process for producing the glass-ceramic sintered body which comprises adding a binder to a mixed powder of an $SiO_2$—$Al_2O_3$—$MgO$—$ZnO$—$B_2O_3$ type crystalline glass and alumina, molding the mixture into a predetermined shape, and firing the mixture into a predetermined shape, and firing the molded mixture at a temperature of 925° to 1000° C. in a non-oxidizable atmosphere. The glass-ceramic sintered body and the substrate composed of it in accordance with the present invention have excellent mechanical strength and thereby have markedly increased metallizing adhesion strength.

5 Claims, No Drawings

GLASS-CERAMIC SINTERED BODY, A PROCESS FOR ITS PREPARATION AND A GLASS-CERAMIC SUBSTRATE

BACKGROUND OF THE INVENTION

1. (Field of the Invention)

This invention relates to a glass-ceramic sintered body used as a substrate for loading an integrated circuit and electronic components parts, a process for its production, and a glass-ceramic substrate.

More specifically, it relates to a glass-ceramic sintered body used for loading an integrated circuit (IC) and electronic component parts thereon which sintered body has a high flexural strength, and an increased adhesion strength of a metallizing portion, a process for its production, and a glass-ceramic substrate of the sintered body.

2. (Description of the Prior Art)

A multilayer circuit substrate obtained by integrally firing a plurality of laminated sheets having a predetermined conductive pattern is available as a circuit substrate used, for example, as a hybrid integrated circuit of an electronic device. This multilayer circuit substrate is required to have (1) a thermal expansion coefficient near the thermal expansion of Si (about $35 \times 10^{-7}/°C.$), (2) a high mechanical strength, (3) a low permittivity, and (4) to be able to be fired at a low temperature of about 800° to 1000° C. Among them, (1) is a property which is required to maintain good continuity to an Si chip even under severe temperature environments. The property (2) is a characteristic required to prevent the destruction of the substrate due to stress applied to the substrate or breaking of the substrate in the step of connecting various electronic components or input or output terminals to the multilayer circuit substrate. The property (3) is necessary to increase the speed of propagating a signal of an electronic circuit provided in the multilayer circuit substrate. The property (4) is necessary for using a metal having a low melting point with a low wiring resistance, such as gold, silver or copper as an internal wiring material.

Japanese Laid-Open Patent Publication No. 321258/1992 discloses a composition for production of a multilayer circuit substrate which satisfies the above-mentioned properties, said composition comprising 50 to 90% weight of $SiO_2$—$Al_2O_3$—$MgO$—$ZnO$—$B_2O_3$ type crystalline glass and 10 to 50% by weight of alumina. The crystalline glass of the composition for making a multilayer substrate contains $SiO_2$, $Al_2O_3$, $MgO$, $ZnO$ and $B_2O_3$ in predetermined proportions so that in the crystalline phase after firing, a cordierite phase ($2MgO.2Al_2O_3.5SiO_2$) is mainly formed, or the composition is fired so that the cordierite phase is mainly formed.

The adhesion strength of the metallized portion in the circuit substrate is greatly affected by the extent of the flexural strength of the substrate material. When the adhesion strength of the metallized portion in the glass-ceramic substrate is evaluated, if the metallized portion is sufficiently conjugated with the interface of the porcelain, the porcelain in a portion to which the metallized portion adheres is destructed to show a so-called porcelain peeling. Accordingly, in the glass-ceramic substrate, the metallizing strength increases when the flexural strength of the porcelain is high. However, a conventional substrate has a very low flexural strength of about 20 $Kg/mm^2$, and a very low metallizing strength of 2 $Kg/mm^2$ or below.

When the adhesion strength of the metallizing portion becomes low as mentioned above, the metallizing portion tends to peel off easily when a lead wire is connected to an input or output terminal portion or when heat treatment is carried out, for example, at the time of plating. Accordingly, the reliability of the substrate becomes a problem.

SUMMARY OF THE INVENTION

The present inventors assiduously investigated the above-mentioned problems, and found that by firing a composition composed of a crystalline glass composed of a predetermined composition and alumina at a temperature higher than the hitherto employed temperatures, for example, at 925° to 1000° C., a spinel crystalline phase is produced from the liquid phase at the time of firing to reinforce the glass phase and the mechanical strength of the porcelain can be increased. This has led to the present invention.

It is an object of the present invention to provide a glass-ceramic sintered body in which the mechanical strength of the substrate is high and therefore the adhesion strength of the metallized portion can be increased, and a process for the production of the above sintered body.

Another object of the present invention is to provide a glass-ceramic substrate composed of the above-mentioned glass-ceramic sintered body.

According to this invention, there is provided a glass-ceramic sintered body composed of an $SiO_2$—$Al_2O_3$—$MgO$—$ZnO$—$B_2O_3$ type crystalline glass and alumina, wherein a spinel crystalline glass phase exists in the sintered body in an amount of at least 10% by weight.

According to another aspect of the present invention, there is provided a process for producing a glass-ceramic sintered body which comprises adding a binder to a mixed powder containing an $SiO_2$—$Al_2O_3$—$MgO$—$ZnO$—$B_2O_3$ type crystalline glass and alumina, molding the mixture into a predetermined shape, and firing the molded mixture in a non-oxidizing atmosphere at a temperature of 925° C. to 1000° C.

According to a further aspect of the present invention, there is provided a glass-ceramic substrate comprising an insulator composed of a sintered body containing an $SiO_2$—$Al_2O_3$—$MgO$—$ZnO$—$B_2O_3$ type crystalline glass and alumina, and a wiring layer composed mainly of copper built in the insulator, the insulator containing at least 10% by weight of a spinel crystalline phase.

DETAILED DESCRIPTION OF THE PREFERRED EMBODIMENT

The glass-ceramic sintered body of this invention is a glass-ceramic sintered body composed of an $SiO_2$—$Al_2O_3$—$MgO$—$ZnO$—$B_2O_3$ type crystalline glass and alumina, and is characterized in that a spinel crystalline phase exists in the sintered body in an amount of at least 10% by weight.

By precipitating at least 10% by weight of the spinel crystalline phase in the glass, the flexural strength of the sintered body or the substrate becomes high and correspondingly, the adhesion strength of the metallizing portion increases.

If the spinel crystalline phase is caused to exist in an amount of lees than 10% by weight, the strength of the porcelain decreases, and correspondingly, the metallizing strength decreases. The spinel crystalline phase is desirably contained in an amount of 10 to 40%, especially 18 to 30% by weight, in the sintered body from the viewpoint of increasing the porcelain strength and the metallizing strength.

The spinel crystalline phase in the present invention is mainly a spinel having a chemical composition $MgAl_2O_4$. The present invention may include spinel $MgAl_2O_4$ in which a part of Mg is replaced by Zn. Furthermore, the sintered body may include cordierite or other crystals in addition to the above spinel crystal.

The $SiO_2$—$Al_2O_3$—$MgO$—$ZnO$—$B_2O_3$ type crystalline glass may contain, for example, 40 to 16% by weight of $SiO_2$, 25 to 30% by weight of $Al_2O_3$, 8 to 13% by weight of MgO, 6 to 9% by weight of ZnO, and 8 to 11% by weight of $B_2O_3$ in the glass in order to form a spinel crystal in the liquid phase. Especially, it may be composed of 42 to 45% by weight of $SiO_2$, 27 to 30% by weight of $Al_2O_3$, 10 to 12% by weight of MgO, 7 to 9% by weight of ZnO, and 9 to 10% by weight of $B_2O_3$.

In the present invention, the above crystalline glass may desirably be contained in an amount of 65 to 90% in the sintered body, and the alumina may desirably be contained in an amount of 10 to 35% by weight. Furthermore, the amount of the crystalline glass in the sintered body may desirably be 70 to 80% by weight, and the amount of the alumina desirably be 20 to 30% by weight.

The glass-ceramic sintered body can, for example, be obtained by mixing a predetermined amount of an alumina powder as a ceramic filler with a crystalline glass powder composed of the above-mentioned predetermined amounts of $SiO_2$, $Al_2O_3$, MgO, ZnO and $B_2O_3$, thereafter, as required, adding a binder, a plasticizer, and a solvent such as toluene, molding the mixture into a predetermined shape, and then firing the molded mixture at 925° to 1000° C. in a non-oxidizing atmosphere for 0.1 to 2.0 hours. The firing temperature is desirably 950° to 1000 ° C. The non-oxidizing atmosphere denotes in this invention an atmosphere of $N_2$, $R_2$ or Ar, or a $N_2$ atmosphere containing $H_2O$.

It is important that the binder added into the molded article decomposes well upon heating in a non-oxidizing atmosphere, and a methacrylic acid resin or the like resin can be favorably used. The binder is decomposed and is removed at a temperature of from 200° to 800° C. prior to the firing. In order to remove trace amounts of carbon that remains after the binder is decomposed, the water vapor ($H_2O$) is introduced into the above-mentioned atmosphere for heat treatment. From the standpoint of heat conductivity dynamics, the temperature at which the reaction proceeds between water vapor and carbon is not lower than above 690° C. To efficiently proceed this reaction, therefore, it is important that the glass ceramic material starts shrinking upon firing at a temperature of not lower than 690° C. and, particularly, not lower than 730° C.

To form a spinel crystalline phase in the glass in this invention, it is important to adjust the firing temperature to 925° to 1000° C. Furthermore, by setting the firing temperature at 925° to 1000° C. and by adjusting the temperature raising speed to 100° to 600° C./h, the spinel crystalline phase becomes easier to form. The temperature raising speed is preferably 100° to 300° C./h.

The glass-ceramic substrate of the present invention is formed by building a wiring layer composed mainly of copper in an insulator body.

To form the copper wiring, a paste containing copper powder is printed onto a green sheet of an ordinary glass-ceramic by a screen printing method or the like method to form a wiring pattern, or the via holes are filled with the copper paste. The copper paste is blended with a methacrylic acid resin that decomposes well upon heating. The green sheets are laminated in a plural number one upon the other and are adhered together. Thereafter, the laminated material fired at the above-mentioned firing temperature.

For a substrate which requires a high degree reliability, nickel my be plated maintaining a thickness of 2 to 3 µm on the copper-metallized layer and, then, gold may be plated maintaining a thickness of 0.5 to 1 µm thereon.

In the glass-ceramic sintered body and the substrate of the present invention, by precipitating the spinel crystalline phase in the glass phase in an amount of at least 10% in the sintered body, the flexural strength of the sintered body increases to at least 25 $Kg/mm^2$, and correspondingly, %he adhesion strength of the metallizing portion increases to at least 3 $Kg/mm^2$. A binder is added to a mixed powder containing an $SiO_2$—$Al_2O_3$—$MgO$—$ZnO$—$B_2O_3$ type crystalline glass and alumina, the mixture is molded into a predetermined shape, and the molded mixture is fired at a temperature of 925° to 1000° C. to thereby precipitate at least 10% by weight of a spinel crystalline phase in the glass.

EXAMPLES

First of all, a powder of glass of the type containing $SiO_2$—$Al_2O_3$—$MgO$—$ZnO$—$B_2O_3$ (44% by weight of $SiO_2$, 29% by weight of $Al_2O_3$, 11% by weight of MgO, 7% by weight of ZnO, and 9% by weight of $B_2O_3$) and an alumina powder were mixed in accordance with the composition shown in Table 1. A binder, a plasticizer and toluene were added to this mixture, and a green sheet having a thickness of 300 µm was prepared from the resulting mixture by a doctor blade method. Isobutyl methacrylate (iBMA) was used as the binder and dibutyl phthalate (DBP) was used as the plasticizer. A paste composed mainly of copper was printed on the green sheet, and four to twenty layers of the resulting printed sheets were laminated. The resulting laminated body was removed free of the binder at 750° C. in wet nitrogen, and the resulting product was fired under the conditions shown in Table 1 in a dry nitrogen atmosphere to give a glass-ceramic multilayer circuit substrate.

The binder of the copper paste was the same as that of the green sheet.

The flexural strength and the metallizing strength of the resulting multilayer circuit substrate were measured, and the amount of crystals in the multilayer circuit substrate was also measured. The flexural strength was measured by a 3-point bending test in accordance with JIS-R-1681. The amount of crystals was measured by preparing a calibration curve by an X-ray diffraction on a sample obtained by mixing a standard substance with each crystalline phase, and on the basis of this calibration curve, the amount of crystals is measured from the peak intensity ratio of the individual crystalline in the sintered body. The metallizing strength was measured as follows: A paste composed mainly of copper was printed so that dimension after firing became 2 mm in diameter, and the paste-printed producing was fired under the conditions described in Table 1. Then a lead line was conjugated with copper metallized portion by using a solder, and under a condition of a load of 20 mm/min, a perpendicular tensile test was conducted. The copper paste that was evaluated was the one obtained by adding 0.5% by weight of an amorphous glass powder of $SiO_2$—$Al_2O_3$—$B_2O_3$—RO (RO: alkaline earth metal oxide) as an inorganic additive to 100% by weight of a copper powder of spherical particles having a particle diameter of about 5 µm, and the binder in the paste was the isobutyl methacrylate (iBMA). The results are shown in Table 1.

TABLE 1

| Sample No. | Crystalline glass (wt. %) | Alumina (wt. %) | Temp. elevating rate (°C./h) | Calcination Temp. (°C.) | Calcination Time (hr) | Flexural strength (kg/mm$^2$) | Crystalline phase (wt. %) in the sintered body cordierite | Crystalline phase (wt. %) in the sintered body spinel crystal | Metallizing strength (kg/mm$^2$) |
|---|---|---|---|---|---|---|---|---|---|
| 1 | 70 | 30 | 300 | 1000 | 1 | 30 | 5 | 30 | 3.7 |
| 2 | 70 | 30 | 300 | 950 | 1 | 28 | 3 | 16 | 3.5 |
| 3 | 70 | 30 | 300 | 925 | 1 | 26 | 2 | 11 | 3.4 |
| *4 | 70 | 30 | 300 | 900 | 1 | 21 | 4 | 7 | 1.8 |
| 5 | 70 | 30 | 100 | 1000 | 1 | 28 | 7 | 30 | 3.2 |
| 6 | 70 | 30 | 600 | 1000 | 1 | 27 | 2 | 20 | 3.2 |
| 7 | 70 | 30 | 100 | 950 | 1 | 26 | 4 | 18 | 3.3 |
| 8 | 70 | 30 | 600 | 950 | 1 | 25 | 2 | 15 | 3.0 |
| 9 | 65 | 35 | 300 | 1000 | 1 | 28 | 5 | 20 | 3.3 |
| *10 | 70 | 30 | 100 | 900 | 1 | 22 | 8 | 8 | 2.0 |
| *11 | 70 | 30 | 600 | 900 | 1 | 20 | 3 | 5 | 1.7 |
| 12 | 75 | 25 | 300 | 1000 | 1 | 27 | 4 | 29 | 3.4 |
| 13 | 70 | 30 | 600 | 925 | 1 | 25 | 4 | 10 | 3.0 |
| 14 | 70 | 30 | 300 | 950 | 2 | 27 | 4 | 19 | 3.6 |
| 15 | 80 | 20 | 300 | 950 | 1 | 26 | 7 | 20 | 3.2 |
| 16 | 90 | 10 | 300 | 950 | 0.1 | 27 | 3 | 23 | 3.2 |
| 17 | 75 | 25 | 100 | 1000 | 2 | 30 | 8 | 40 | 3.6 |

*shows materials outside the range of the invention.

From Table 1, the samples of the present invention had a flexural strength of at least 25 Kg/mm$^2$ and accordingly, the metallizing strengths of the samples were at least 3 Kg/m$^2$. On the other hand, since samples obtained in Comparative Examples had low flexural strengths, they had low metallizing strengths.

The present inventors prepared a glass-ceramic sintered body from crystalline glass in which the proportions of SiO$_2$, Al$_2$O$_3$, MgO, and ZnO and B$_2$O$_3$ are varied within the range of the above composition and alumina, and measured its flexural strength. When it was fired at a temperature of at least 925° C., the spinel crystalline phase was precipitated in an amount of an least 10% by weight based on the sintered body in the glass. As a result, it was confirmed that the flexural strength of the sintered body increased to at least 25 Kg/mm$^2$ and its metallizing strength increased to at least 3 Kg/mm$^2$.

What is claimed:

1. A glass-ceramic sintered body comprising an SiO$_2$—Al$_2$O$_3$—MgO—ZnO—B$_2$O$_3$ crystalline glass and alumina, wherein a spinel crystalline phase which is precipitated chiefly from the crystalline glass exists in an amount of at least 10% by weight in the sintered body and the spinel crystalline phase is MgAl$_2$O$_4$ spinel in which a part of Mg may be replaced by Zn wherein in the crystalline glass, the content of the SiO$_2$ component is 40 to 46% by weight, the content of the Al$_2$O$_3$ component is 25 to 30% by weight, the content of the MgO component is 8 to 13% by weight, the content of the ZnO component is 6 to 9% by weight, and the content of the B$_2$O$_3$ component is 8 to 11% by weight, and the sintered body contains 65 to 90% by weight of the crystalline glass and 10 to 35% by weight of alumina.

2. The glass-ceramic sintered body of claim 1 wherein the crystalline glass, the content of the SiO$_2$ component is 42 to 45% by weight, the content of the Al$_2$O$_3$ component is 27 to 30% by weight, the content of the MgO component is 10 to 12% by weight, the content of the ZnO component is 7 to 9% by weight, and the content of the B$_2$O$_3$ component is 9 to 10% by weight, and the sintered body contains 70 to 80% by weight of the crystalline glass and 20 to 30% by weight of alumina.

3. The glass-ceramic sintered body of claim 1 or 2 wherein the sintered body contains 10 to 40% by weight of the spinel crystalline phase.

4. A process for the production of a glass-ceramic sintered body wherein a binder is added to a mixed powder composed of 65 to 90% by weight of an SiO$_2$—Al$_2$O$_3$—MgO—ZnO—B$_2$O$_3$ crystalline glass composed of 40 to 46% by weight of the SiO$_2$ component, 25 to 30% by weight of the Al$_2$O$_3$ component, 8 to 13% by weight of the MgO component, 6 to 9% by weight of the ZnO component, and 8 to 11% by weight of the B$_2$O$_3$ component and 10 to 35% by weight of alumina, the mixed powder is molded into a shape, and the resulting mixture is fired at a temperature of 925° to 1000° C. in a non-oxidizable atmosphere to form a spinel crystalline phase, the spinel crystalline phase being composed of MgAl$_2$O$_4$ in which a part of Mg may be replaced by Zn and being precipitated chiefly from the crystalline glass in the sintered body.

5. The process of claim 4 wherein the firing of the mixture is carried out by raising the temperature at a rate of 100° to 600° C./hr to a firing temperature of 925° to 1000° C.

* * * * *